United States Patent [19]

Weiner et al.

[11] Patent Number: 4,900,947

[45] Date of Patent: Feb. 13, 1990

[54] ASYNCHRONOUS MARX GENERATOR UTILIZING PHOTO-CONDUCTIVE SEMICONDUCTOR SWITCHES

[75] Inventors: Maurice Weiner, Ocean; Anderson H. Kim; Lawrence J. Bovino, both of Eatontown, all of N.J.

[73] Assignee: The United States of America as represented by the Secretary of the Army, Washington, D.C.

[21] Appl. No.: 188,933

[22] Filed: May 2, 1988

[51] Int. Cl.$^4$ ............................................. H02M 3/18
[52] U.S. Cl. ..................................... 307/110; 363/59; 250/551; 376/105
[58] Field of Search ............... 376/105; 250/550, 551, 250/211 R; 307/110; 363/59, 60

[56] References Cited

U.S. PATENT DOCUMENTS

| | | | |
|---|---|---|---|
| 3,639,849 | 2/1972 | Bennet | 376/105 |
| 4,375,594 | 3/1983 | Ewanizky, Jr. | 307/110 |
| 4,577,114 | 3/1986 | Levy et al. | 250/551 |
| 4,645,941 | 2/1987 | Nicolas | 307/110 |
| 4,695,733 | 9/1987 | Pasavento | 250/551 |

OTHER PUBLICATIONS

"Modeling of the Optically Controlled Semiconductor Switch" by M. Weiner, L. Bovino, R. Youmans, and T. Burke, 1986 American Institute of Physics.
"Recent Advances in Optically Controlled Bulk Semiconductor Switches", L. Bovino, T. Burke, R. Youmans, M. Weiner, J. Carter, Pulse Power Conference, Jun. 1985.
"Optically Activated Switch Technology", Maurice Weiner, Lawrence J. Bovino, Terence Burke, Robert J. Youmans, Melvin J. Wade. Army Science Conference, 17-19 Jun. 1986.
"Optically Controlled, High Power, High Speed Semiconductor Switches", L. Bovino, M. Weiner, T. Burke. Electro-87 Meeting.

Primary Examiner—R. J. Hickey
Attorney, Agent, or Firm—Michael Zelenka; John T. Rehberg; Roy E. Gordon

[57] ABSTRACT

A Marx high voltage generator with a fast rise time. Photoconductive semiconductor switches are sequentially triggered by a single laser via fiber optic bundles of different lengths. The switches serve to series connect a group of charged capacitors. Output is taken from the last capacitor which receives the voltage accumulated on all of the previous capacitors. Proper timing of the activation of each switch produces a fast rise time.

6 Claims, 2 Drawing Sheets

ASYNCHRONOUS MARX GENERATOR UTILIZING PHOTO-CONDUCTIVE SEMICONDUCTOR SWITCHES

The invention described herein may be manufactured, used, and licensed by or for the Government for governmental purposes without the payment of any royalties thereon or therefor.

TECHNICAL FIELD

This invention relates generally to high voltage pulse generators and more specifically to generators of the Marx type in which capacitors are charged in parallel and discharged in series.

BACKGROUND OF THE INVENTION

Among the many techniques for producing high voltage pulses, the Marx generator is one of the most popular. The Marx generator exhibits a combination of short rise time and low output impedance. It also provides large energy, high efficiency and waveform flexibility.

The essence of the Marx principle is to charge a number of capacitive storage elements (electrostatic energy stores) in parallel and then, through transient switching techniques connect (or "erect") the elements in series, thus producing an effective multiplication of the source voltage. In the original generator described by Erwin Marx in 1923, the capacitors were charged in parallel through high resistances and the switches were simple two-electrode spark gaps triggered by the over-voltage accumulating from the switching of previous stages.

Another Marx design utilizes thyratrons to control switching, as disclosed in U.S. Pat. No. 4,375,594, entitled "Thyratron Marx High Voltage Generator", issued to Ewanizky, Jr.

Although conventional Marx circuits are adequate for achieving moderately fast rise times (greater than ten nanoseconds), a modification of the Marx circuit must be implemented in order to achieve ultra fast rise times (less than one nanosecond). Those concerned with the development of pulse power technology have consistently sought methods and apparatus which will provide generators with faster rise times.

SUMMARY OF THE INVENTION

It is therefore an object of this invention to provide an improved high voltage generator.

It is another object of this invention to provide a Marx generator with an ultra fast rise time.

It is a further object of this invention to provide a Marx generator with a highly reliable triggering mechanism.

To achieve the foregoing objects, photo-conductive semiconductor switches are used to control the sequential discharge of the Marx capacitors. The switches are sequentially activated via fiber optic bundles from a laser. Sequential triggering of the Marx capacitors is achieved by firing the laser into a larger fiber optic bundle. The large bundle is divided into a group of smaller bundles, each of which is connected to a particular semiconductor switch. The small fiber bundles have different lengths. The length of each small fiber bundle is chosen to control the amount of time that elapses between laser firing and switch activation. Thus, the switches are activated sequentially. The timing of each switch is governed by the length of the fiber optic bundle connecting it to the laser.

As will be explained further below, a better understanding of the operation of the inventive device will be gained by taking into account its transmission-line like characteristics. A transmission line analysis is presented below which aids in understanding the behavior of ultra fast rise time generators.

BRIEF DESCRIPTION OF THE DRAWINGS

Further object and advantages of the present invention will become apparent to those familiar with the art upon examination of the following detailed description and accompanying drawings in which.

DETAILED DESCRIPTION OF THE DRAWINGS

Figure 1:
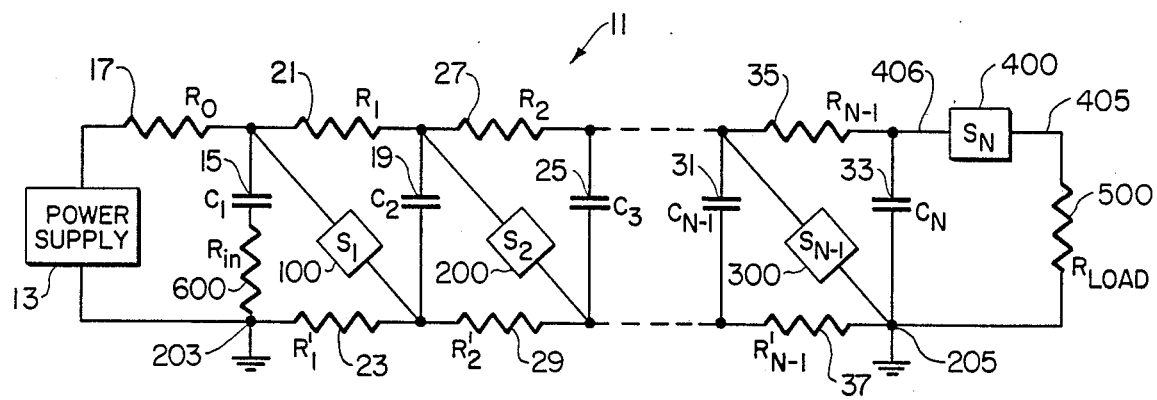
FIG. 1 is a circuit schematic of the inventive device.

In FIG. 1, a portion of the inventive device is designated generally by reference numeral 11. The device may contain an arbitrary number of stages. In FIG. 1, "N" designates the number of stages.

Operation of the inventive device has two phases—a charge phase and a discharge phase. The charge phase proceeds as follows: a DC power supply 13 energizes capacitor $C_1$, denoted by reference number 15 through resistor $R_0$, denoted by reference numeral 17. Any convenient source of DC power capable of sufficiently charging the capacitors $C_1$–$C_N$ may be used. All of the switches $S_1$ through $S_N$ denoted by reference numerals 100, 200, 300 and 400 are open. After capacitor $C_1$ denoted by reference numeral 15 is charged, capacitor $C_2$, denoted by reference numeral 19 is charged via resistors $R_1$ denoted by reference numeral 21 and $R_1'$ denoted by reference numeral 23. Subsequently, capacitor $C_3$ denoted by reference numeral 25 is charged via resistors $R_2$ denoted by reference numeral 27 and $R_2'$ denoted by reference numeral 29. Ultimately, capacitor $C_{N-1}$ denoted by reference numeral 31 is charged and capacitor $C_N$ denoted by reference numeral 33 is subsequently charged via resistors $R_{N-1}$ denoted by reference numeral 35 and $R'_{N-1}$ denoted by reference numeral 37. Essentially, capacitors $C_1$ through $C_N$ denoted by reference numerals 15, 19, 25, 31 and 33 respectively, have been charged by power supply 13 in parallel.

The generator is discharged ("erected") by sequentially closing switch $S_1$ designated by reference numeral 100, then closing $S_2$ designated by reference numeral 200 through $S_{N-1}$ designated by reference numeral 300 and $S_N$ designated by reference numeral 400. Each of these switches $S_1$–$S_N$ is an optically activated (photoconductive) semiconductor device. An example of the desired switch is found in U.S. Pat. No. 4,577,114, issued to Levy, et al., which is hereby incorporated by reference. Another example of a suitable switch is provided by co-pending patent application Ser. No. 111,746, entitled "High Energy Optically Controlled Kilovolt Semiconductor Switch" which is assigned to the same assignee as the present invention and which is also incorporated by reference. Typically these switches are blocks of bulk semi-insulating gallium arsenide with ohmic contacts at two ends. The carrier density of the gallium arsenide is substantially increased by irradiating it with a laser, thus creating a low resistance path between the ohmic contacts and closing the switch.

Figure 3:
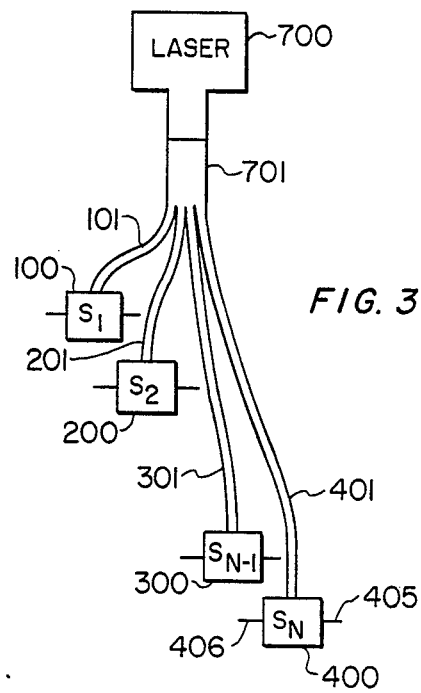
FIG. 3 is a diagram which, taken in conjunction with FIG. 1 describes the inventive device.

FIG. 3 is a diagram which illustrates how sequential closing of switches $S_1-S_N$ is accomplished. In FIG. 3 laser 700 is a light source, preferably either a Q-switched or mode-locked Nd: YAG laser. Laser 700 is connected to fiber optic bundle 701. Fiber optic bundle 701 is subdivided into smaller bundles 101, 201, 301, and 401. Each of the smaller bundles 101–104 is connected to a respective switch $S_1-S_N$ designated by reference numerals 100–400. The lengths of fiber optic bundles 101–401 are chosen to ensure sequential closing of switches $S_1-S_N$. That is, the difference between the lengths of fiber optic bundles 101 and 201 multiplied by the speed of light in the fiber optic material equals the amount of time required for the voltage pulse of capacitor C designated by reference numeral 19 to reach switch $S_2$ designated by reference numeral 200.

The photo-conductive switches $S_1-S_N$ are essentially jitter-free and provide precise, reliable triggering of each stage of the Marx generator. The sequential triggering of $S_1-S_N$ insures that the leading edges of the voltage pulses of each stage are perfectly aligned and add in unison. If the switches are triggered either too early or too late, a degradation n the overall rise time of the generator will result. Precise control of the firing time of the individual stages can be relatively easily achieved because approximately one foot of fiber optic bundle corresponds to approximately one nanosecond delay.

Figure 2:
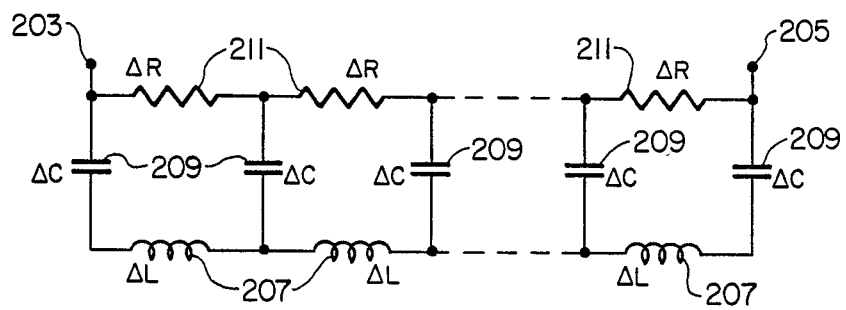
FIG. 2 is a circuit depicting a conventional transmission line model which is useful in understanding the inventive device.

A better understanding of the operation of the inventive device and its advantages can be gained by realizing that the network depicted in FIG. 1 has transmission line characteristics. To that end, it is appropriate to realize that the ground return path between nodes 203 and 205 of FIG. 1 may be modeled as the return path of a conventional transmission line. FIG. 2 depicts a conventional transmission line mode. The circuit of FIG. 2, with incremental resistance $\Delta R$, incremental capacitance $\Delta C$, and incremental inductance $\Delta L$, is assumed to be connected between nodes 203 and 205 of FIG. 1. The circuit of FIG. 2 with its incremental impedance and reactance is merely an aid to the understanding of the operation of the inventive device of FIGS. 1 and 3. The circuit components of FIG. 2 is not an explicit portion of the inventive device.

As mentioned before, each of the stages of the transmission line model of FIG. 2 contains incremental or distributed inductance and capacitance associated with the coupling between the ground line and the inventive device of FIG. 1. When switch $S_1$ is triggered, there will be an inherent delay time $\Delta t$, associated with $\Delta L$ and $\Delta C$ of the transmission line; $\Delta t$, is roughly equal to $\sqrt{\Delta L \Delta C}$. The voltage wave produced by the discharge of capacitor $C_2$ designated by reference numeral 19 in FIG. 1 will therefore, not reach the next stage (i.e. switch $S_2$) until a time equal to $\Delta t$ has elapsed. Consequently, switch $S_2$ should not be triggered until a time $\Delta t$ has elapsed after the triggering of switch $S_1$. Similarly, switch $S_3$ (not shown in FIG. 1) should not be fired until $2\Delta t$ has elapsed after the triggering of switch $S_2$, and so forth. Therefore, knowing the amount of time required for light from laser 700 in FIG. 3 to traverse a specified length of fiber bundle, the difference in lengths between fiber optic bundles 201 and 101 can easily be determined.

The sequential operation of switches $S_1-S_N$ is essential in order to preserve the fast rise time of the voltage pulse. When switches $S_1-S_N$ are triggered in the fashion just described, the leading edges of the voltage pulses are perfectly aligned and add in unison. A growing wave is produced as the switches are sequentially fired. If the switches are triggered either too early or too late, a degradation in rise time will result. In particular, if the switches are fired simultaneously, a circuit degradation in the rise time equal to $N\Delta t$ will result. In slower conventional Marx circuits, such a slow down will not normally be observed. However, in designing a nanosecond rise time pulses, particular care must be given to the transmission line nature of the circuit, thus dictating sequentially triggering of the switches.

Switches $S_1-S_N$ are themselves characterized by nanosecond rise times and low jitter. Without illumination, the bulk semiconductor has a high off-state resistivity and there is no current flow. When the semiconductor is illuminated, it suddenly becomes conductive.

Figure 4:
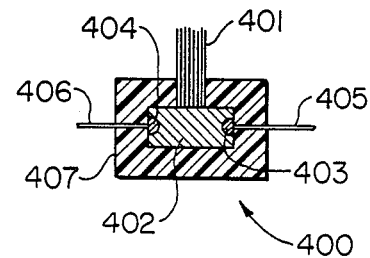
FIG. 4 is a cross sectional view of a switch depicted in FIGS. 1 and 3.

The details of photoconductive switch construction can be understood by reference to FIG. 4. In FIG. 4, reference numeral 402 denotes a block of bulk gallium arsenide. Reference numerals 403 and 404 denote ohmic contacts and references numerals 405 and 406 denote leads attached to the ohmic contacts. Fiber optic bundle 401 abuts the side of block 402. A holder 407, preferably of plastic, serves to maintain bundle 401 in proximity to block 402. The switch is turned on when block 402 is illuminated with light energy from laser 700 via bundle 401. The length of block 402 between contacts 403 and 404 generally determines the voltage hold-off capacity of the switch.

The output of generator 11 appears across load resistor 500. It should be mentioned that in the circuit of FIG. 11, the voltage multiplication is $NV_0/2$ rather than $NV_0$ (where $V_0$ is the bias voltage across each of the capacitors $C_1-C_N$). The difference is caused by the existence of a backward wave (as well as a forward wave) which is generated with each capacitive discharge. However, the backward wave has a relatively long rise time (approximately $2N\Delta t$ for sequential triggering) and is normally not useful. Input resistor 600 is used to terminate the backward wave so as to prevent reflections which will degrade the rise time of the pulse seen at load resistor 500. In a conventional Marx circuit this degradation is tolerated since the rise time requirement is usually not as stringent. Both input resistor 600 and load resistor 500 should be equal to the characteristic impedance of circuit 11.

The lumped capacitors $C_1-C_N$ are, of course, electrostatic storage devices and may be replaced by pulse forming lines. Should pulse forming lines be substituted for capacitor $C_1-C_N$, a matched condition between the pulse forming lines and the overall Marx transmission lines should exist. Such matching is accomplished when the impedance of the pulse forming lines is twice that of the Marx line.

The entire inventive device shown in FIG. 1 may be assembled on an insulator board. The components shown in FIG. 1, i.e. switches, resistors and capacitors may be assembled and connected on top of the board and a strip or plate of conductive material placed on the underside of the board to serve as a ground return.

While the invention has been understood with respect to a specific embodiment, it should be understood that other variations may be made in the particular designs and configurations without departing from the scope of the invention as set forth in the appended claims and their equivalents.

What is claimed is:

1. A device comprising:
   a plurality of means for electrostatic storage connected in parallel;
   a plurality of optically controlled switches having a first optically controlled switch, said switches being connected in series between pairs of said means for electrostatic storage;
   means for independently activating the plurality of serially connected, optically controlled switches in a controlled sequential manner beginning with the first switch so that each successive switch is activated upon the arrival of the voltage wavefront which is generated by the activation of the first switch and which propagates in the direction of the remaining switches.

2. The device of claim 1 wherein said switches contain semiconducting gallium arsenide and said switches further have two ohmic contacts.

3. The device of claim 1 wherein said means for electrostatic storage is a pulse forming line.

4. The device of claim 1 wherein said means for electrostatic storage is a capacitor.

5. The device of claim 1 wherein said means for activating said switches is a light source and a plurality of fiber optic bundles having a plurality of lengths so as to precisely time switch activation connected between said light source and said switches.

6. The device of claim 5 wherein said source is a YAG laser.

* * * * *